United States Patent
Hu et al.

(10) Patent No.: US 10,385,169 B2
(45) Date of Patent: Aug. 20, 2019

(54) MANUFACTURER METHOD FOR FULLERENCE/PEDOT:PSS MIXED SOLUTION

(71) Applicant: Shenzhen China Star Optoelectronics Technology Co., Ltd., Shenzhen (CN)

(72) Inventors: Tao Hu, Shenzhen (CN); Yue Wu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/024,912

(22) Filed: Jul. 2, 2018

(65) Prior Publication Data

US 2018/0312644 A1 Nov. 1, 2018

Related U.S. Application Data

(62) Division of application No. 14/786,549, filed on Oct. 23, 2015, now Pat. No. 10,066,062.

(30) Foreign Application Priority Data

Jul. 20, 2015 (CN) .......................... 2015 1 0427292

(51) Int. Cl.
*C09D 125/18* (2006.01)
*C08J 3/07* (2006.01)
(Continued)

(52) U.S. Cl.
CPC ................. *C08J 3/07* (2013.01); *C08J 3/215* (2013.01); *C08J 5/18* (2013.01); *C08K 3/045* (2017.05); *C08L 25/18* (2013.01); *C08L 65/00* (2013.01); *C09D 5/24* (2013.01); *C09D 7/61* (2018.01); *C09D 125/18* (2013.01); *H01L 51/0003* (2013.01); *H01L 51/004* (2013.01); *H01L 51/0037* (2013.01); *H01L 51/0046* (2013.01); *C08G 2261/1424* (2013.01);
(Continued)

(58) Field of Classification Search
CPC ........ C09D 5/24; C09D 11/52; C09D 125/18; C08J 3/03; C08J 3/07; C08J 3/09; C08J 3/215; C08J 5/15; C08J 5/18; C08L 25/18; C08L 65/00; C08K 3/045; H01B 1/04; H01B 1/127
USPC ......................................... 524/713; 106/31.92
See application file for complete search history.

(56) References Cited

U.S. PATENT DOCUMENTS

2014/0312281 A1* 10/2014 Jackson .............. H01L 51/0047
                                                        252/500
2017/0040543 A1* 2/2017 Lee ........................ C09K 11/06
(Continued)

*Primary Examiner* — Brian K Talbot
(74) *Attorney, Agent, or Firm* — Leong C. Lei

(57) ABSTRACT

A method for manufacturing a fullerence/PEDOT:PSS mixed solution includes the following steps: Step 1, preparing a fullerence solution by mixing fullerence molecules and water or a strong polar solvent, wherein the fullerence molecules are fullerence or fullerence derivants and the fullerence derivants are water-soluble fullerence derivants or water-insoluble fullerence derivants; and Step 2, mixing the fullerence solution and a PEDOT:PSS dilute solution of a certain concentration at a mass ration of 1:100 to 100:1 via mechanical agitation or ultrasonication to form a fullerence/PEDOT:PSS mixed solution in homogeneous dispersions.

8 Claims, 1 Drawing Sheet

--- step 1. making fullerence solution by mixing fullerence molecules and water or strong polar solvent; the fullerence molecules are fullerence or fullerence derivants, and the fullerence derivants are water-soluble fullerence derivants or water-insoluble fullerence derivants; ⟶ 1 step 2. performing mixing the fullernece solution and a PEDOT:PSS dilute solution with a certain concentration at a mass ration of 1:100 to 100:1 via mechanical agitation or ultrasonication to obtain a fullerence / PEDOT:PSS mixed solution in homogeneous dispersions. ⟶ 2

(51) Int. Cl.
*C08J 5/18* (2006.01)
*C08L 65/00* (2006.01)
*C09D 7/61* (2018.01)
*C08J 3/215* (2006.01)
*C09D 5/24* (2006.01)
*H01L 51/00* (2006.01)
*C08L 25/18* (2006.01)
*C08K 3/04* (2006.01)
*H01B 1/04* (2006.01)
*H01B 1/12* (2006.01)
*G02F 1/1343* (2006.01)
*H01L 51/10* (2006.01)
*H01L 51/44* (2006.01)
*H01L 51/52* (2006.01)

(52) U.S. Cl.
CPC ............... *C08G 2261/3223* (2013.01); *C08G 2261/794* (2013.01); *C08J 2325/18* (2013.01); *C08J 2465/00* (2013.01); *G02F 1/13439* (2013.01); *G02F 2202/022* (2013.01); *G02F 2202/16* (2013.01); *H01B 1/04* (2013.01); *H01B 1/127* (2013.01); *H01L 51/0021* (2013.01); *H01L 51/102* (2013.01); *H01L 51/441* (2013.01); *H01L 51/5206* (2013.01)

(56) References Cited

U.S. PATENT DOCUMENTS

2017/0092866 A1* 3/2017 Blouin .................... C07C 35/44
2017/0237011 A1* 8/2017 Nishihara ............ C07D 495/04
                                                              252/500
2017/0294585 A1* 10/2017 Morse .................... C07C 13/62

* cited by examiner

MANUFACTURER METHOD FOR FULLERENCE/PEDOT:PSS MIXED SOLUTION

CROSS REFERENCE TO RELATED APPLICATIONS

This is a divisional application of co-pending U.S. patent application Ser. No. 14/786,549, filed on Oct. 23, 2015, which is a national stage of PCT Application No. PCT/CN2015/087673, filed on Aug. 20, 2015, claiming foreign priority of Chinese Patent Application No. 201510427292.1, filed on Jul. 20, 2015.

TECHNICAL FIELD

The present invention relates to a display manufacture filed, in particular to a manufacture method for fullerence/PEDOT:PSS mixed solution and a manufacture method for compound transparent conductive film having fullerence/PEDOT:PSS.

BACKGROUND

In display technical field, a flat panel display as a liquid crystal display (LCD), an organic light emitting diode (OLED), and so forth is gradually substituted for cathode ray tube (CRT) monitor, and are applied to the liquid crystal display television, cell phone, personal digital assistant, calculator panel, or laptop panel.

A display panel is an important part of LCD or OLED; take LCD for example: the display panel is mainly composed of a thin film transistor (TFT) substrate, a color filter (CF) substrate, and a liquid crystal layer between the thin film transistor substrate and the color filter substrate; the working principles is that a driving voltage is applied to an transparent conductive electrode on the TFT substrate and the CF substrate to control the rotation of liquid crystal elements of the liquid crystal layer; furthermore, the light of a backlight module will be reflected to produce image, and the backlight provides different colors through the CF substrate; therefore, therefore, the performance of materials of the transparent conductive electrode has a great influence on the display effect.

Currently, a traditional transparent conductive film is an indium tin oxide (ITO) film manufacturing by Physical Vapor Deposition (PVD). The specific manufacturing process is that: in a PVD device, a strong current bombards ITO targets and a transparent conductive ITO film is deposited on the substrate. The properties of the transparent conductive ITO film are high light transmittance, high conductivity and stable structure. However, because it takes a long time in the manufacturing process, the resistance of the ITO is higher, and the film cannot show the bending characteristic at a certain external force according to physical properties of the ITO film thereof; therefore, it limits the applications in flexible panel and wearable device as well. It has important significance and value to seek high conductivity, high transmittance, simple manufacture method, and abound resource substitutes for ITO.

Poly-3,4-ethylenedioxythiophene/poly-styrenesulfonate (PEDOT:PSS) is a macromolecule polymer, and is largely applied in several areas as organic photovoltaic (OPV), organic field effect transistor (OFET), organic light-emitting diode (OLED) and flexible panel; a film formation with the macromolecule polymer has a high stability, high light transmittance and high conductivity; besides, the resistance of the ITO film can use distribution ratio adjustment to make widely windows, and be suitable for large-scaled flexographic printing. A study shows that adding few glycerol or sorbitol in PEDOT:PSS can obviously increase conductivity without losing light transmittance. Fullerene, such as $C_{60}$ and $C_{70}$, are allotrope of element carbon with a shape similar to a soccer and every carbon atom in $SP^2$ hybridization mode achieves three-dimensional aromatic. Although the solubility of pure fullerence is poor, many type of soluble functional group are induced by chemically modified method and so the solubility of aqueous solution/organic solvent is increased without affecting conductivity. As an excellent carriers-transporting material, it can be used well in OPV, OFET, OLED and flexible device.

DISCLOSURE OF INVENTION

An object of the present invention is to provide a manufacture method of fullerence/PEDOT:PSS mixed solution, and then making fullerence/PEDOT:PSS mixed solution to manufacture a transparent conductive film; sources of applicable materials are broad and prices thereof are cheap; the fullerence/PEDOT:PSS mixed solution can be further utilized to manufacture a compound transparent conductive film having fullerence/PEDOT:PSS.

Another object of the present invention is further providing a manufacture method for compound transparent conductive film having fullerence/PEDOT:PSS. Comparing manufacturing a compound transparent conductive film having fullerence/PEDOT:PSS via wet coating process with low cost and high efficiency with manufacturing with of ITO film, expensive PVD equipment can be waived, production cost can be reduced, manufacturing method can be simplified at the same time, production time is shorter, economic efficiency can be increased and the method can be adopted to scale-up area film formation.

To achieve aforementioned objects, a manufacture method for fullerence/PEDOT:PSS mixed solution is provided in the present invention and comprises following steps:

Step 1, making fullerence solution by mixing fullerence molecules and water or strong polar solvent;

The fullerence molecules are fullerence or fullerence derivants, and the fullerence derivants are water-soluble fullerence derivants or water-insoluble fullerence derivants;

Step 2, performing mixing the fullerence solution and a PEDOT:PSS dilute solution with a certain concentration at a mass ration of 1:100 to 100:1 via mechanical agitation or ultrasonication to obtain a fullerence/PEDOT:PSS mixed solution in homogeneous dispersions.

The Step 1 particularly is: according to water-soluble fullerence derivants and deionized water at a mass ratio of 1:100-10000, inserting the water-soluble fullerence derivants into the deionized water and performing ultrasound dispersion or mechanical agitation for obtaining homogeneous dispersions thereof to gain fullerence aqueous dispersions, performing centrifugation or filtration to the fullerence aqueous dispersions to remove large particle aggregates to gain the fullerence solution, and then measuring the actual concentration thereof via spectrophotometry.

The Step 1 particularly is: according to fullerence or water-insoluble fullerence derivants, surfactant and deionized water at a mass ratio of 1:50-500:50-10000 to insert the fullerence or the water-insoluble fullerence derivants and surfactant into the deionized water and performing ultrasound dispersion or mechanical agitation for obtaining homogeneous dispersions thereof to gain fullerence aqueous dispersions, performing centrifugation or filtration to the fullerence aqueous dispersions to remove large particle aggregates to gain the fullerence solution, and then measuring the actual concentration thereof via spectrophotometry.

The surfactant is sodium lauryl sulfate, ammonium dodecyl sulphate, sodium dodecyl sulfonate, sodium dodecyl benzene sulfonate, or sodium tetradecyl sulfate.

The Step 1 particularly is: according to fullerence or water-insoluble fullerence derivants and strong polar solvent at a mass ratio of 1:100-10000 to insert the fullerence or the water-insoluble fullerence derivants into the strong polar solvent and performing ultrasound dispersion or mechanical agitation for obtaining homogeneous dispersions thereof to gain fullerence aqueous dispersions, performing centrifugation or filtration to the fullerence aqueous dispersions to remove large particle aggregates to gain the fullerence solution, and then measuring the actual concentration thereof via spectrophotometry;

The strong polar solvent is methonal, N,N-dimethyl formamide or dimethyl sulfoxide.

A concentration of the fullerence molecules of the fullerence solution obtained in the step 1 is 0.1-10 mg/ml, and the PEDOT:PSS dilute solution in step 2 is made of deionized water and PEDOT:PSS solution with a mass percentage of PEDOT:PSS solution of 1-100 wt % in the PEDOT:PSS dilute solution.

A manufacture method for a compound transparent conductive film having fullerence/PEDOT:PSS is further provided in the present invention and comprises following steps:

Step 10, manufacturing the fullerence/PEDOT:PSS mixed solution according to the aforementioned method;

Step 20, providing a substrate, coating the substrate with fullerence/PEDOT:PSS mixed solution via wet coating process and then performing film formation to obtain a fullerence/PEDOT:PSS film;

Step 30, the substrate on which a film was formed is heat treated on a thermostatted hot plate to be curable by removing solution in the fullerence/PEDOT:PSS film;

Step 40, performing multiple washes to the cured fullerence/PEDOT:PSS film with deionized water to remove the rest solution, surfactant and impurities in the film and further to increase the conductivities of the fullerence/PEDOT:PSS film;

Step 50, performing drying process to the fullerence/PEDOT:PSS film to remove water in the film and then further obtaining a compound transparent conductive film having fullerence/PEDOT:PSS and with dry and uniform film quality on the substrate.

In the Step 20, the substrate is a glass substrate or a flexible substrate; the wet coating process is spraying coating, spin coating, roll-coating, slot-die coating, dip coating, spread coating, gravure printing, ink-jet printing or screen printing.

In the Step 30, the temperature of the thermostatted hot plate is from 60-150° C. and the baking time is 3-10 min.

The drying process technology in the step 50 is natural drying, blow-drying with nitrogen or flash baking at 80-120° C.

Another manufacture method for a compound transparent conductive film having fullerence/PEDOT:PSS is further provided in the present invention and comprises following steps:

Step 10, manufacturing the fullerence/PEDOT:PSS mixed solution according to the aforementioned method;

Step 20, providing a substrate, coating the substrate with fullerence/PEDOT:PSS mixed solution via wet coating process and then performing film formation to obtain a fullerence/PEDOT:PSS film;

Step 30, the substrate on which a film was formed is heat treated on a thermostatted hot plate to be curable by removing solution in the fullerence/PEDOT:PSS film;

Step 40, performing multiple washes to the cured fullerence/PEDOT:PSS film with deionized water to remove the rest solution, surfactant and impurities in the film and further to increase the conductivities of the fullerence/PEDOT:PSS film;

Step 50, performing drying process to the fullerence/PEDOT:PSS film to remove water in the film and then further obtaining a compound transparent conductive film having fullerence/PEDOT:PSS and with dry and uniform film quality on the substrate;

wherein, in the Step 20, the substrate is a glass substrate or a flexible substrate; the wet coating process is spraying coating, spin coating, roll-coating, slot-die coating, dip coating, spread coating, gravure printing, ink-jet printing or screen printing;

wherein, in the Step 30, the temperature of the thermostatted hot plate is from 60-150° C. and the baking time is 3-10 min;

wherein the drying process technology in the Step 50 is natural drying, blow-drying with nitrogen or flash baking at 80-120° C.

The beneficial efficiencies of the present invention: a manufacture method of fullerence/PEDOT:PSS mixed solution is provided in the present invention, and then making fullerence/PEDOT:PSS mixed solution to manufacture a transparent conductive film; sources of applicable materials are broad and prices thereof are cheap; the fullerence/PEDOT:PSS mixed solution can be further utilized to manufacture a compound transparent conductive film having fullerence/PEDOT:PSS on substrates or a variety of devices. The present invention discloses a manufacture method for a compound transparent conductive film having fullerence/PEDOT:PSS, and when manufacturing the compound transparent conductive film having fullerence/PEDOT:PSS via wet coating process which is with low cost and high efficiency comparing with manufacture of ITO film, and furthermore expensive PVD equipment can be waived, production cost can be reduced, manufacturing method can be simplified at the same time, production time is shorter, economic efficiency can be increased and the method can be adopted to scale-up area film formation. The compound transparent conductive film having fullerence/PEDOT:PSS manufacturing in the present invention has high stability, uniform film quality, high conductivity and high light transmittance to replace ITO films in the market, and further has high applicable potentiality in flexible devices and wearable devices because of excellent mechanical properties thereof.

In order to further understand characteristics and technical contents of the present invention, please refer to the following detailed description and figures of the present invention; however, the figures is only for references and explaining, not to limit the present invention hereto.

BRIEF DESCRIPTION OF THE DRAWINGS

The technical solution and the beneficial effects of the present invention are best understood from the following detailed description with reference to the accompanying figures and embodiments. In the figures.

DETAILED DESCRIPTION OF THE PREFERRED EMBODIMENTS

To further set forth the technical solution adopted by the present invention and the effects thereof, the present invention is described with reference to the following preferred embodiments and the accompanying figures.

Figure 1:
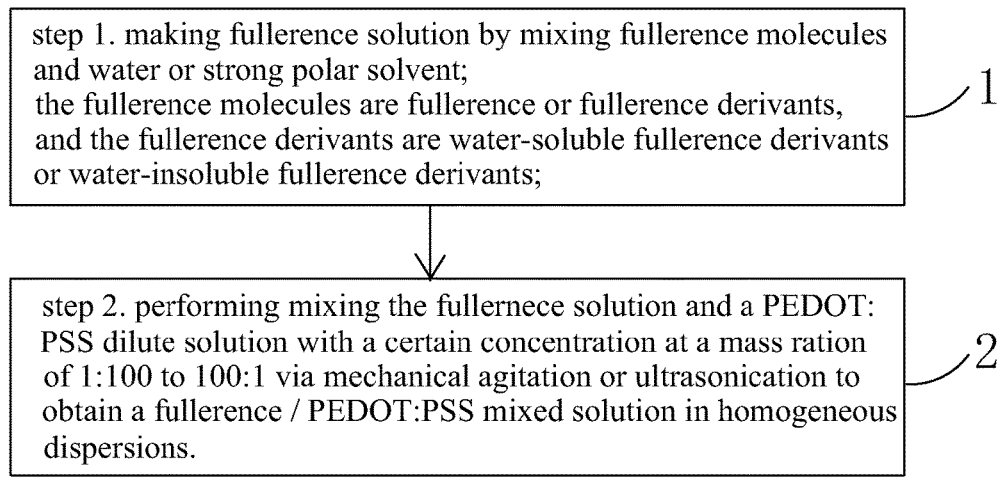
FIG. 1 is a flowchart of a manufacture method for fullerence/PEDOT:PSS mixed solution of the present invention.

Please refer to FIG. 1, firstly the present invention discloses a manufacture method for fullerence/PEDOT:PSS mixed solution comprising the following steps:

Step 1, making fullerence solution by mixing fullerence molecules and water or strong polar solvent;

the fullerence molecules are fullerence or fullerence derivants;

in particular, the fullerence have the structural formula is $C_{28}$, $C_{32}$, $C_{50}$, $C_{60}$, or $C_{70}$ and a property of the fullerence is soluble in certain organic solvent, insoluble or poorly soluble in water.

In particular, according to solution properties of the fullerence derivants in water can be divided in to two categories:

one category is water-insoluble fullerence derivants, for example: fullerence-$Cl_x$, fullerence-$F_x$, fullerence-$Br_x$, or fullerence-$H_x$; wherein x is a natural number greater than 0, and solution properties of the water-insoluble fullerence derivants are similar to solution properties of the fullerence that both are soluble in certain organic solvent, insoluble or poorly soluble in water;

the other category is water-soluble fullerence derivants, for example: fullerence-$(OH)_x$, fullerence-$(TEG)_x$, fullerence-$(COOH)_x$, fullerence-$(TEG)_x(COOH)_y$, and etc.; wherein x and y represent number of induced hydroxyl-OH, carboxyl-COOH or polyethylene glycol group-TEG, and both x and y are natural numbers greater than 0. Preferably, when $x \geq 20$, the solution of the fullerence-$(OH)_x$ is better. The solution of water-soluble fullerence derivants is better in water by inducing a variety of hydrophilic groups.

Therefore, based on difference solution properties of the fullerence, water-insoluble fullerence derivants, and water-soluble fullerence derivants, the Step 1 can be performed by the following 3 particular plans:

Plan 1: according to water-soluble fullerence derivants and deionized water at a mass ratio of 1:100-10000, inserting the water-soluble fullerence derivants into the deionized water and performing ultrasound dispersion or mechanical agitation for obtaining homogeneous dispersions thereof to gain fullerence aqueous dispersions, performing centrifugation or filtration to the fullerence aqueous dispersions to remove large particle aggregates to gain the fullerence solution, and then measuring the actual concentration thereof via spectrophotometry; the concentration of the water-soluble fullerence derivants of the fullerence solution is 0.1-10 mg/ml.

Plan 2: according to fullerence or water-insoluble fullerence derivants, surfactant and deionized water at a mass ratio of 1:50-500:50-10000 to insert the fullerence or the water-insoluble fullerence derivants and surfactant into the deionized water and performing ultrasound dispersion or mechanical agitation for obtaining homogeneous dispersions thereof to gain fullerence aqueous dispersions, performing centrifugation or filtration to the fullerence aqueous dispersions to remove large particle aggregates to gain the fullerence solution, and then measuring the actual concentration thereof via spectrophotometry; the concentration of the fullerence or the water-insoluble fullerence derivants of the fullerence solution is 0.1-10 mg/ml;

particularly, in Plan 2, the surfactant is sodium lauryl sulfate, ammonium dodecyl sulphate, sodium dodecyl sulfonate, sodium dodecyl benzene sulfonate, or sodium tetradecyl sulfate.

Plan 3: according to fullerence or water-insoluble fullerence derivants and strong polar solvent at a mass ratio of 1:100-10000 to insert the fullerence or the water-insoluble fullerence derivants into the strong polar solvent and performing ultrasound dispersion or mechanical agitation for obtaining homogeneous dispersions thereof to gain fullerence aqueous dispersions, performing centrifugation or filtration to the fullerence aqueous dispersions to remove large particle aggregates to gain the fullerence solution, and then measuring the actual concentration thereof via spectrophotometry; the concentration of the fullerence or the water-insoluble fullerence derivants of the fullerence solution is 0.1-10 mg/ml;

particularly, in Plan 3, the strong polar solvent is methonal, N,N-dimethyl formamide or dimethyl sulfoxide.

Particularly, a high power ultrasonic meter is adopted in all plan1 to plan 3 to perform ultrasound dispersion with 500-900 W of ultrasonic power and 10-120 min of ultrasonic time; when a centrifugation method is adopted to remove large particle aggregates in the fullerence aqueous dispersions, the centrifugation apparatus is driven by speed of 2000-5000 rpm for centrifugation time of 5-60 min.

Step 2, performing mixing the fullerence solution and a PEDOT:PSS dilute solution with a certain concentration at a mass ration of 1:100 to 100:1 via mechanical agitation or ultrasonication to obtain a fullerence/PEDOT:PSS mixed solution in homogeneous dispersions.

Particularly, the PEDOT:PSS dilute solution is made of deionized water and PEDOT:PSS solution with a mass percentage of PEDOT:PSS solution of 1-100 wt % in the PEDOT:PSS dilute solution; when the mass percentage of PEDOT:PSS solution in the PEDOT:PSS dilute solution is 100 wt %, the PEDOT:PSS dilute solution is a pure PEDOT:PSS solution.

Particularly, the PEDOT:PSS solution is a water solution made of three materials, PEDOT (poly(3,4-ethylene-dioxythiophen)), PSS (poly(styrene sulfonic acid)) and water, and those materials can be purchased on the market or made in the laboratory; in general, the sum of two materials, PEDOT and PSS, in the PEDOT:PSS solution should be at a mass percentage (which is solid content) of 1-6 wt %.

A manufacture method of fullerence/PEDOT:PSS mixed solution is provided in the present invention, and then making fullerence/PEDOT:PSS mixed solution by fullerence molecules and a fullerence/PEDOT:PSS solution; sources of applicable materials are broad and prices thereof are cheap; the fullerence/PEDOT:PSS mixed solution can be further utilized to manufacture a compound transparent conductive film having fullerence/PEDOT:PSS on substrates or a variety of devices.

The fullerence molecules adopted in the present invention are spherical molecules and easily to form a homogeneous system with PEDOT:PSS solution; in addition, the spherical structures is not easy to aggregate that the stability of the homogeneous solution can be increase to guaranty the high conductive stability and excellent uniform film quality of the compound transparent conductive film having fullerence/PEDOT:PSS in the present invention.

Besides, the fullerence molecules as excellent electron-acceptor units can efficiently increase conductivity thereof by inserting into PEDOT:PSS; furthermore, light transmittance of the compound transparent conductive film having fullerence/PEDOT:PSS will not be decreased because of bad light absorptivity of the fullerence molecules in the visible light range, therefore, the compound transparent conductive film having fullerence/PEDOT:PSS with high conductivity and high light transmittance is made in the present invention.

Furthermore, a manufacture method for compound transparent conductive film having fullerence/PEDOT:PSS is further provided in the present invention, comprising following steps:

Step 10, manufacturing the fullerence/PEDOT:PSS mixed solution according to the aforementioned method.

Step 20, providing a substrate, coating the substrate with fullerence/PEDOT:PSS mixed solution via wet coating process and then performing film formation to obtain a fullerence/PEDOT:PSS film;

particularly, the substrate can be a glass substrate, but also can be a flexible substrate such as PET;

the wet coating process is a technology such as spraying coating, spin coating, roll-coating, slot-die coating, dip coating, spread coating, gravure printing, ink-jet printing or screen printing.

Step 30, the substrate on which a film was formed is heat treated on a thermostatted hot plate to be curable by removing solution in the fullerence/PEDOT:PSS film.

particularly, the temperature of the thermostatted hot plate is from 60-150° C. and the baking time is 3-10 min.

Step 40, performing multiple washes to the cured fullerence/PEDOT:PSS film with deionized water to remove the rest solution, surfactant and impurities in the film and further to increase the conductivities of the fullerence/PEDOT:PSS film.

Step 50, performing drying process to the fullerence/PEDOT:PSS film to remove water in the film and then further obtaining a compound transparent conductive film having fullerence/PEDOT:PSS and with dry and uniform film quality on the substrate;

particularly, methods of the drying process technology can be natural drying, blow-drying with nitrogen or flash baking at 80-140° C.

Figure 2:
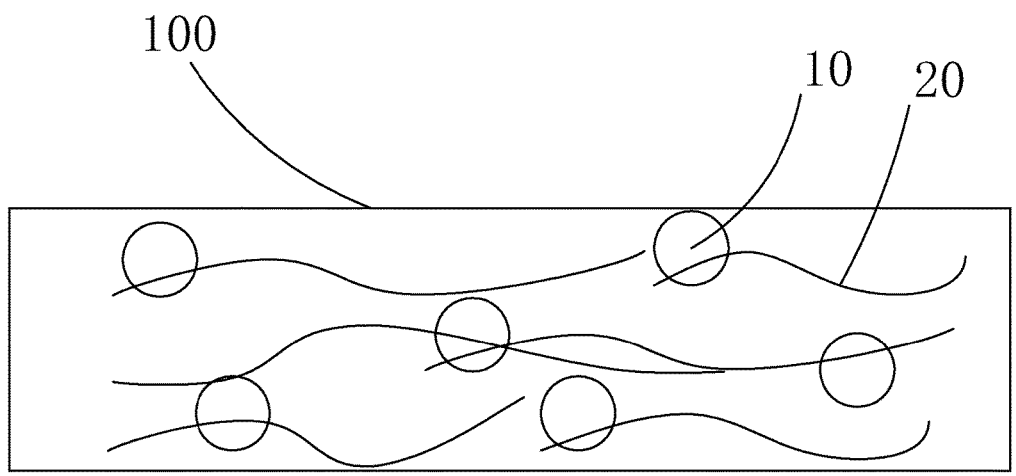
FIG. 2 is a structural perspective view representing a compound transparent conductive film having fullerence/PEDOT:PSS manufactured by the manufacture method for compound transparent conductive film having fullerence/PEDOT:PSS in the present invention.

As shown in FIG. 2, the compound transparent conductive film 100 having fullerence/PEDOT:PSS made in the step 50, the fullerence molecules 10 (the fullerence or the fullerence derivants) and PEDOT:PSS aggregators 20 are homogeneously dispersing in the film to have the compound transparent conductive film 100a with uniform film quality, high stability, high conductivity and high light transmittance of.

The present invention discloses a manufacture method for a compound transparent conductive film having fullerence/PEDOT:PSS, and when manufacturing the compound transparent conductive film having fullerence/PEDOT:PSS via wet coating process which is with low cost and high efficiency comparing with manufacture of ITO film, and furthermore expensive PVD equipment can be waived, production cost can be reduced, manufacturing method can be simplified at the same time, production time is shorter, economic efficiency can be increased and the method can be adopted to scale-up area film formation. The compound transparent conductive film having fullerence/PEDOT:PSS manufacturing in the present invention has high stability, uniform film quality, high conductivity and high light transmittance to replace ITO films in the market, and further has high applicable potentiality in flexible devices and wearable devices because of excellent mechanical properties thereof.

An embodiment 1 of the manufacture method for compound transparent conductive film having fullerence/PEDOT:PSS of the present invention:

Step 1, according to water-soluble fullerence derivants $C_{60}(OH)_{24}$ and deionized water at a mass ratio of 1:100, inserting the water-soluble fullerence derivants $C_{60}(OH)_{24}$ into the deionized water and performing ultrasound dispersion with 500 W ultrasonic power and 120 min ultrasonic time for obtaining homogeneous dispersions thereof to gain fullerence aqueous dispersions in homogeneous dispersions, performing filtration to the fullerence aqueous dispersions to remove large particle aggregates to gain the fullerence solution, and then measuring the actual concentration thereof via spectrophotometry; the concentration of the water-soluble fullerence derivants $C_{60}(OH)_{24}$ in the fullerence solution is 6 mg/ml.

Step 2, performing mixing the fullerence solution and a PEDOT:PSS dilute solution with a certain concentration at a mass ration of 1:100 via mechanical agitation or ultrasonication to obtain a fullerence/PEDOT:PSS mixed solution in homogeneous dispersions;

the mass percentage of the PEDOT:PSS solution in the PEDOT:PSS dilute solution is 50 wt %, and the mass percentages of PEDOT, PSS and water in the PEDOT:PSS solution are 0.5 wt %, 1 wt % and 98.5 wt % individually;

Step 3, providing a glass substrate, applying the art of spraying coating on the glass substrate with fullerence/PEDOT:PSS mixed solution and then performing film formation to obtain a fullerence/PEDOT:PSS film;

Step 4, the substrate on which a film was formed is heat treated on a thermostatted hot plate at 60° C. for 10 min to be curable by removing solution in the fullerence/PEDOT:PSS film;

Step 5, performing multiple washes to the cured fullerence/PEDOT:PSS film with deionized water to remove the rest impurities in the film and further to increase the conductivities of the fullerence/PEDOT:PSS film;

Step 6, performing natural drying process to the fullerence/PEDOT:PSS film to remove water in the film and then further obtaining a compound transparent conductive film having fullerence/PEDOT:PSS and with dry and uniform film quality on the substrate.

An embodiment 2 of the manufacture method for compound transparent conductive film having fullerence/PEDOT:PSS in the present invention:

Step 1, according to water-insoluble fullerence derivants $C_{60}Br_{24}$, sodium dodecyl benzene sulfonate and deionized water at a mass ratio of 1:50:9050 to insert the fullerence or the water-insoluble fullerence derivants $C_{60}Br_{24}$ and sodium dodecyl benzene sulfonate into the deionized water and performing mechanical agitation for obtaining homogeneous dispersions thereof to gain fullerence aqueous dispersions, performing centrifugation with 5000 rpm of centrifugation and 5 min of the centrifugation time to the fullerence aqueous dispersions for removing large particle aggregates to gain the fullerence solution, and then measuring the actual concentration thereof via spectrophotometry; the concentration of the water-insoluble fullerence derivants $C_{60}Br_{24}$ in the fullerence solution is 0.05 mg/ml;

Step 2, performing mixing the fullerence solution and a PEDOT:PSS dilute solution with a certain concentration at a mass ration of 1:1 via mechanical agitation or ultrasonication to obtain a fullerence/PEDOT:PSS mixed solution in homogeneous dispersions;

the mass percentage of the PEDOT:PSS solution in the PEDOT:PSS dilute solution is 50 wt %, and the mass percentages of PEDOT, PSS and water in the PEDOT:PSS solution are 0.5 wt %, 1.5 wt % and 98 wt % individually.

Step 3, providing a glass substrate, applying the art of spin coating on the glass substrate with fullerence/PEDOT:PSS mixed solution and then performing film formation to obtain a fullerence/PEDOT:PSS film;

Step 4, the substrate on which a film was formed is heat treated on a thermostatted hot plate at 150° C. for 3 min to be curable by removing solution in the fullerence/PEDOT:PSS film;

Step 5, performing multiple washes to the cured fullerence/PEDOT:PSS film with deionized water to remove the rest sodium dodecyl benzene sulfonate and impurities in the film and further to increase the conductivities of the fullerence/PEDOT:PSS film;

Step 6, performing blow-drying process with nitrogen to the fullerence/PEDOT:PSS film to remove water in the film and then further obtaining a compound transparent conductive film having fullerence/PEDOT:PSS and with dry and uniform film quality on the substrate.

An embodiment 3 of the manufacture method for compound transparent conductive film having fullerence/PEDOT:PSS in the present invention:

Step 1, according to fullerence $C_{60}$ and strong polar solvent at a mass ratio of 1:200 to insert the fullerence $C_{60}$ into N,N'-dimethyl formamide and performing ultrasound dispersion with 900 W ultrasonic power and 10 min ultrasonic time for obtaining homogeneous dispersions thereof to gain fullerence aqueous dispersions, performing centrifugation to the fullerence aqueous dispersions to remove large particle aggregates to gain the fullerence solution, and then measuring the actual concentration thereof via spectrophotometry; the concentration of the fullerence solution $C_{60}$ in the fullerence solution is 3 mg/ml.

Step 2, performing mixing the fullerence solution and a PEDOT:PSS solution with a certain concentration at a mass ration of 100:1 via mechanical agitation or ultrasonication to obtain a fullerence/PEDOT:PSS mixed solution in homogeneous dispersions;

the mass percentages of PEDOT, PSS and water in the PEDOT:PSS solution are 0.5 wt %, 2.5 wt % and 97 wt % individually;

Step 3, providing a glass substrate, applying the art of spraying coating on the glass substrate with fullerence/PEDOT:PSS mixed solution and then performing film formation to obtain a fullerence/PEDOT:PSS film;

Step 4, the substrate on which a film was formed is heat treated on a thermostatted hot plate at 100° C. for 5 min to be curable by removing solution in the fullerence/PEDOT:PSS film;

Step 5, performing multiple washes to the cured fullerence/PEDOT:PSS film with deionized water to remove the rest solution and impurities in the film and further to increase the conductivities of the fullerence/PEDOT:PSS film;

Step 6. performing natural baking to dry process in an oven at 100° C. to the fullerence/PEDOT:PSS film to remove water in the film and then further obtaining a compound transparent conductive film having fullerence/PEDOT:PSS and with dry and uniform film quality on the substrate.

In summary, a manufacture method for fullerence/PEDOT:PSS mixed solution provided in the present invention is adopting fullerence molecules and PEDOT:PSS solution to manufacture a fullerence/PEDOT:PSS mixed solution, and sources of applicable materials are broad and prices thereof are cheap; the fullerence/PEDOT:PSS mixed solution can be further utilized to manufacture a compound transparent conductive film having fullerence/PEDOT:PSS on a substrate or a variety of devices; the present invention discloses a manufacture method for a compound transparent conductive film having fullerence/PEDOT:PSS, and when manufacturing the compound transparent conductive film having fullerence/PEDOT:PSS via wet coating process which is with low cost and high efficiency comparing with manufacture of ITO film, and furthermore expensive PVD equipment can be waived, production cost can be reduced, manufacturing method can be simplified at the same time, production time is shorter, economic efficiency can be increased and the method can be adopted to scale-up area film formation; the compound transparent conductive film having fullerence/PEDOT:PSS manufacturing in the present invention has high stability, uniform film quality, high conductivity and high light transmittance to replace ITO films in the market, and further has high applicable potentiality in flexible devices and wearable devices because of excellent mechanical properties thereof.

Based on the description given above, those having ordinary skills in the art may easily contemplate various changes and modifications of the technical solution and technical ideas of the present invention and all these changes and modification are considered within the protection scope of the right for the present invention.

What is claimed is:
1. A method for manufacturing a fullerence/PEDOT:PSS mixed solution, comprising the following steps:
   Step 1, preparing a fullerence solution by mixing fullerence molecules and water or a strong polar solvent, wherein the fullerence molecules are fullerence or fullerence derivants and the fullerence derivants are water-soluble fullerence derivants or water-insoluble fullerence derivants; and
   Step 2, mixing the fullerence solution and a PEDOT:PSS dilute solution of a certain concentration at a mass ration of 1:100 to 100:1 via mechanical agitation or ultrasonication to form a fullerence/PEDOT:PSS mixed solution in homogeneous dispersions.

2. The method according to claim 1, wherein Step 1 comprises: mixing the water-soluble fullerence derivants and deionized water with a mass ratio between the water-soluble fullerence derivants and deionized water being 1:100-10000; performing ultrasound dispersion or mechanical agitation for homogeneous dispersions so as to form fullerence aqueous dispersions; performing centrifugation or filtration to the fullerence aqueous dispersions to remove large particle aggregates so as to form the fullerence solution; and then measuring a concentration of the fullerene solution via spectrophotometry.

3. The method according to claim 1, wherein Step 1 comprises: mixing the fullerence or the water-insoluble fullerence derivants, surfactant and deionized water with a mass ratio among the fullerence or water-insoluble fullerence derivants, surfactant and deionized water being 1:50-500:50-10000; performing ultrasound dispersion or mechanical agitation for homogeneous dispersions so as to form fullerence aqueous dispersions; performing centrifugation or filtration to the fullerence aqueous dispersions to remove large particle aggregates so as to form the fullerence solution; and then measuring a concentration of the fullerence solution via spectrophotometry.

4. The method according to claim 3, wherein the surfactant comprises one of sodium lauryl sulfate, ammonium dodecyl sulphate, sodium dodecyl sulfonate, sodium dodecyl benzene sulfonate, and sodium tetradecyl sulfate.

5. The method according to claim 1, wherein Step 1 comprises: mixing the fullerence or the water-insoluble fullerence derivants and the strong polar solvent with a mass ratio between fullerence or water-insoluble fullerence derivants and the strong polar solvent being 1:100-10000; performing ultrasound dispersion or mechanical agitation for homogeneous dispersions so as to form fullerence aqueous dispersions; performing centrifugation or filtration to the fullerence aqueous dispersions to remove large particle aggregates so as to form the fullerence solution; and then measuring a concentration of the fullerence solution via spectrophotometry.

6. The method according to claim 5, wherein the strong polar solvent comprises one of methonal, N,N-dimethyl formamide, and dimethyl sulfoxide.

7. The method according to claim 1, wherein a concentration of the fullerence molecules of the fullerence solution prepared in Step 1 is 0.1-10 mg/ml.

8. The method according to claim 1, wherein the PEDOT:PSS dilute solution formed in Step 2 is made of deionized water and PEDOT:PSS solution with a mass percentage of PEDOT:PSS solution of 1-100 wt % in the PEDOT:PSS dilute solution.

* * * * *